(12) United States Patent
Chumakov

(10) Patent No.: US 8,569,171 B2
(45) Date of Patent: Oct. 29, 2013

(54) MASK-BASED SILICIDATION FOR FEOL DEFECTIVITY REDUCTION AND YIELD BOOST

(75) Inventor: Dmytro Chumakov, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 13/175,709

(22) Filed: Jul. 1, 2011

(65) Prior Publication Data

US 2013/0001654 A1    Jan. 3, 2013

(51) Int. Cl.
*H01L 21/337* (2006.01)

(52) U.S. Cl.
USPC ........... 438/682; 438/186; 438/592; 438/595; 438/597

(58) Field of Classification Search
USPC .......................... 438/592, 595; 257/E21.445
See application file for complete search history.

(56) References Cited

U.S. PATENT DOCUMENTS

| | | | | |
|---|---|---|---|---|
| 5,998,873 A | * | 12/1999 | Blair et al. | 257/766 |
| 6,100,125 A | * | 8/2000 | Hulfachor et al. | 438/224 |
| 6,319,784 B1 | * | 11/2001 | Yu et al. | 438/301 |
| 6,329,256 B1 | * | 12/2001 | Ibok | 438/299 |
| 6,410,420 B2 | * | 6/2002 | Akram et al. | 438/630 |
| 6,537,884 B1 | * | 3/2003 | Yogo et al. | 438/286 |
| 7,468,303 B2 | * | 12/2008 | Sugihara | 438/305 |
| 2003/0228742 A1 | * | 12/2003 | Huang | 438/581 |
| 2004/0147082 A1 | * | 7/2004 | Kim | 438/301 |
| 2009/0117736 A1 | * | 5/2009 | Mebarki et al. | 438/660 |
| 2010/0279459 A1 | * | 11/2010 | Huang et al. | 438/98 |
| 2011/0065245 A1 | * | 3/2011 | Chen et al. | 438/197 |

* cited by examiner

*Primary Examiner* — Angel Roman
(74) *Attorney, Agent, or Firm* — Ditthavong, Mori, Steiner, PC

(57) ABSTRACT

A semiconductor device with reduced defect density is fabricated by forming localized metal silicides instead of full area silicidation. Embodiments include forming a transistor having a gate electrode and source/drain regions on a substrate, forming a masking layer with openings exposing portions of both the gate electrode and source/drain regions over the substrate, depositing metal in the openings on the exposed portions, forming silicides in the openings, and removing unreacted metal and the masking layer.

16 Claims, 4 Drawing Sheets

MASK-BASED SILICIDATION FOR FEOL DEFECTIVITY REDUCTION AND YIELD BOOST

TECHNICAL FIELD

The present disclosure relates to localized silicidation in semiconductor devices. The present disclosure is particular applicable to semiconductor devices in 32 nanometer (nm) technology nodes and beyond.

BACKGROUND

Current front end of line (FEOL) defect density is incompatible with high yields in technologies such as 32 nanometer and below. A strong contributor of defects is the silicide module. Conventionally, full area silicidation is employed, which leads to a naturally high defect density due to the large silicide areas, e.g., nickel silicide (NiSi). A current silicidation process is schematically illustrated in FIGS. 1 through 4. FIGS. 1A (a top view) and 1B (a cross-sectional view) illustrate an FEOL device ready for silicidation with typical transistor gates 101 and spacers 103 on a silicon substrate 105. As illustrated in FIG. 2, nickel (Ni) 201 is deposited over the entire surface. After annealing and stripping unreacted Ni, large silicidated areas 301 are formed, as shown in FIGS. 3A (a top view) and 3B (a cross-sectional view). Typical problems and weaknesses of such an approach are encroachments and stringers, as illustrated in FIG. 4. When NiSi formation extends under the spacers (shown at 401) degradation or destruction of the transistor results. Also, gate-to-active area shorts (shown at 403) are generated by Ni residuals or platinum (Pt) particles. The probability of such defects is extremely high due to the large exposure area.

A need therefore exists for methodology enabling the fabrication of localized NiSi in semiconductors and the resulting devices exhibiting reduced defects.

SUMMARY

An aspect of the present disclosure is a method of forming localized silicides on portions of the gate and source/drain regions of a semiconductor device.

Another aspect of the present disclosure is a semiconductor device including localized silicides on portions of the gate and source/drain regions and exhibiting reduced defects.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a transistor on a substrate, the transistor having a gate electrode and source/drain regions; forming a masking layer over the substrate, the masking layer having openings exposing portions of the gate electrode and portions of the source/drain regions; depositing a metal in the openings on the exposed portions of the gate electrode and source/drain regions; forming metal silicide on the exposed portions of the gate electrode and source/drain regions; and removing unreacted metal and the masking layer.

Aspects of the present disclosure include forming the openings in the masking layer with an aspect ratio of 1:1 to 100:1. Other aspects include forming the openings in the masking layer with a width of 10 nanometer (nm) to 100 nm. Further aspects include the exposed portions of the gate electrode and source/drain regions being less than 100% of the entire gate electrode and source/drain regions, respectively. Another aspect includes forming the masking layer by: forming an inter level dielectric (ILD) on the substrate covering the transistors; forming a lithographic mask on the ILD, the lithographic mask having openings corresponding to the exposed portions of the gate electrode and the source/drain regions; forming trenches in the ILD through the lithographic mask corresponding to the openings; and removing the lithographic mask. Additional aspects include forming trenches having a width of 10 nanometer (nm) to 100 nm. Further aspects include forming trenches with an aspect ratio of at least 5:1. Another aspect includes forming the trenches by etching the ILD through the lithographic mask. Other aspects include depositing the metal to a thickness of 5 nm to 30 nm. Additional aspects include depositing nickel or a nickel alloy as the metal. Further aspects include forming the silicide by annealing. Other aspects include forming a second mask over the transistor and substrate, subsequent to removing unreacted metal and the masking layer, the second mask having openings aligned to the same positions as the lithographic mask. Additional aspects include forming gate and source/drain contacts through the second mask.

Another aspect of the present disclosure is a device comprising: a substrate; a transistor on the substrate, the transistor having a gate electrode and source/drain regions on each side of the gate electrode; spacers between the gate electrode and the source/drain regions; and localized silicide on a portion of the top surface of the gate electrode and a portion of the source/drain regions, the portions being less than 100% of the entire gate electrode and source/drain regions, respectively. Aspects include the silicide having a width of 10 nanometer (nm) to 100 nm.

Another aspect of the present disclosure is a method comprising: forming one or more gate electrodes on a substrate, each gate electrode having spacers on opposite sides thereof; forming source/drain regions in the substrate on opposite sides of each gate electrode; forming an inter level dielectric (ILD) on the source/drain regions and the gate electrodes; forming a lithographic mask on the ILD, the lithographic mask having openings; aligning the openings of the lithographic mask with exposed portions of the gate electrode and portions of the source/drain regions, the portions being less than 100% of the entire gate electrode and source/drain regions, respectively; etching trenches in the ILD through the lithographic mask corresponding to the openings, the trenches having a width of 10 nanometer (nm) to 100 nm and an aspect ratio of 1:1 to 100:1; removing the lithographic mask; depositing a metal in the trenches; annealing the metal to form metal silicide in the trenches; and removing unreacted metal and the ILD.

Aspects include depositing the metal to a thickness of 5 nm to 30 nm. Further aspects include depositing nickel or nickel alloy as the metal. Another aspect includes forming a second ILD on the gate electrodes, the source/drain regions, and the metal silicides, subsequent to removing unreacted metal and the masking layer; forming a second mask on the second ILD, the second mask having openings corresponding to the portions of the gate electrode and the portions of the source/drain regions; and aligning the second mask to the same position as the lithographic mask. Other aspects include etching the ILD through the second mask to form gate and source/drain contact holes down to the metal silicides.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
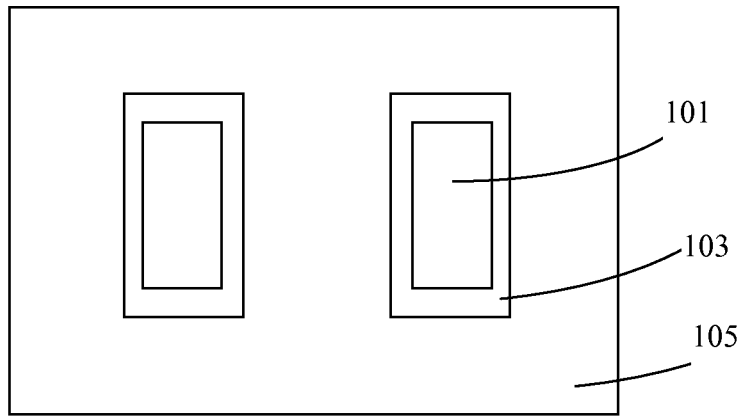
FIGS. 1A and 1B schematically illustrate top and cross-sectional views, respectively, of a conventional an FEOL device ready for silicidation.
Figure 1B:
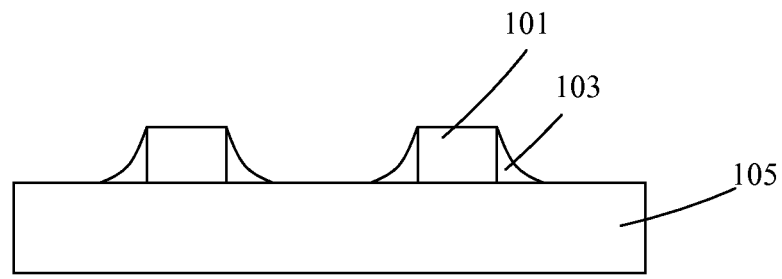
Figure 2:
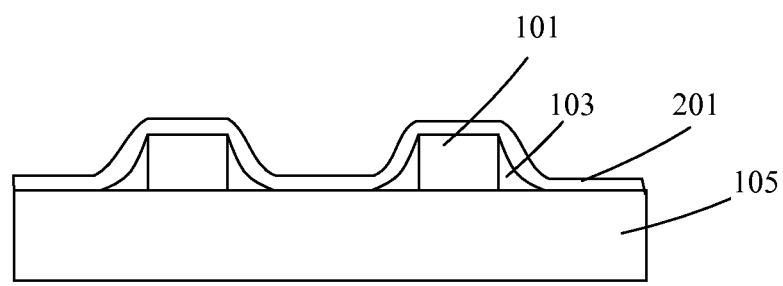
FIG. 2 schematically illustrates large area Ni deposition for the device of FIGS. 1A and 1B.
Figure 3A:
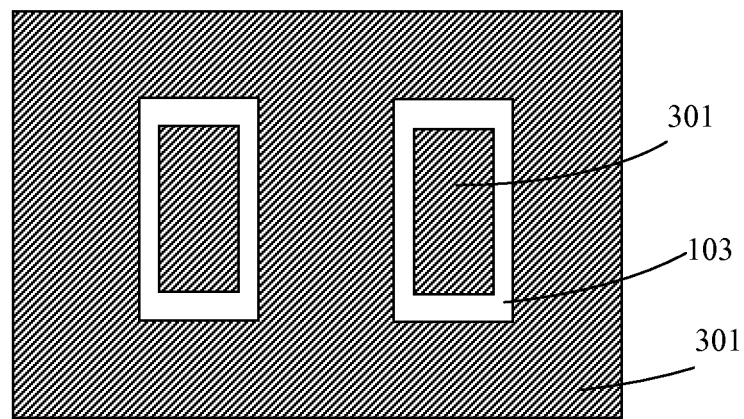
FIGS. 3A and 3B schematically illustrate top and cross-sectional views, respectively, of large silicidated areas after annealing and stripping unreacted Ni from the device of FIG. 2.
Figure 3B:
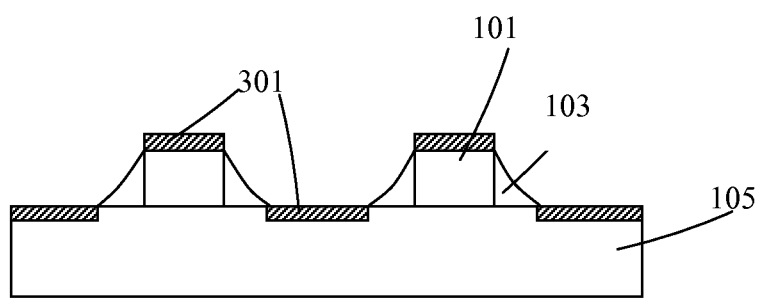
Figure 4:
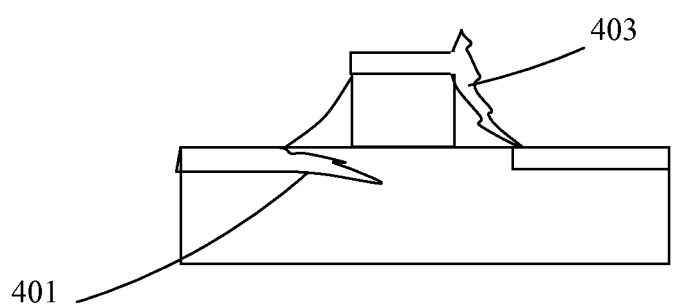
FIG. 4 schematically illustrates encroachments and stringers formed in the device of FIGS. 3A and 3B.
Figure 5:
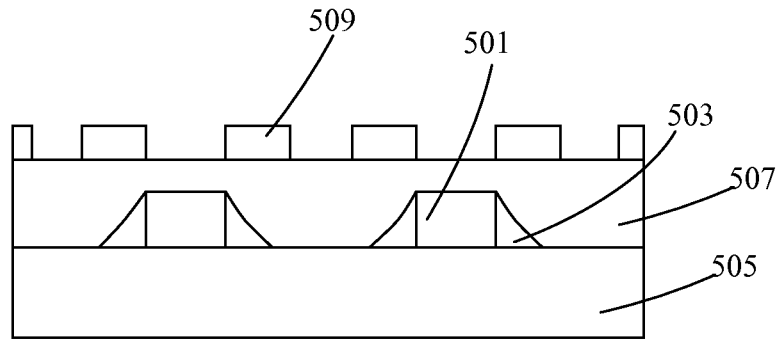
FIGS. 5 through 8, 9A, and 9B schematically illustrate a process flow for forming NiSi in a semiconductor device, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of encroachments and stringers formed as a result of large area metal deposition, e.g., Ni deposition, for FEOL silicidation in semiconductor devices. In accordance with embodiments of the present disclosure, the metal, e.g., Ni, is targeted through a patterned ILD, thereby avoiding large silicidated areas which lead to a high defect density. In addition, because of the large exposure area and a low aspect ratio of, for example, 2:1 for the Ni deposition, current practices require a cleaning step prior to silicidation to remove particle contamination. In accordance with embodiments of the present disclosure, the aspect ratio may be 1:1 to 100:1, for example 5:1, which significantly reduces the particle contamination, and allows for the silicidation clean to be eliminated.

Methodology in accordance with embodiments of the present disclosure includes forming a transistor on a substrate, the transistor having a gate electrode and source/drain regions, forming a masking layer over the substrate, the masking layer having openings exposing portions of the gate electrode and portions of the source/drain regions, depositing a metal in the openings on the exposed portions of the gate electrode and source/drain regions, forming metal silicide on the exposed portions of the gate electrode and source/drain regions, and removing unreacted metal and the masking layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 5 through 8, 9A, and 9B schematically illustrate a process flow for forming targeted and smaller NiSi areas, in accordance with an exemplary embodiment. Adverting to FIG. 5, conventional transistors including gates 501 and spacers 503 are formed on a substrate 505. An interlayer dielectric (ILD) 507, e.g., silicon dioxide ($SiO_2$), is deposited, as at a thickness of 50 nm to 1000 nm, over substrate 505, gates 501, and spacers 503. A lithographic mask 509, for example a sacrificial oxide or hard mask, is printed on ILD 507, with openings at regions to be silicided. The openings may have dimensions of 10 nm to 100 nm. Mask 509 may be aligned to gates 501 or to active regions between gates 501, provided a contact mask is correspondingly aligned to the same position after silicidation.

Figure 6:
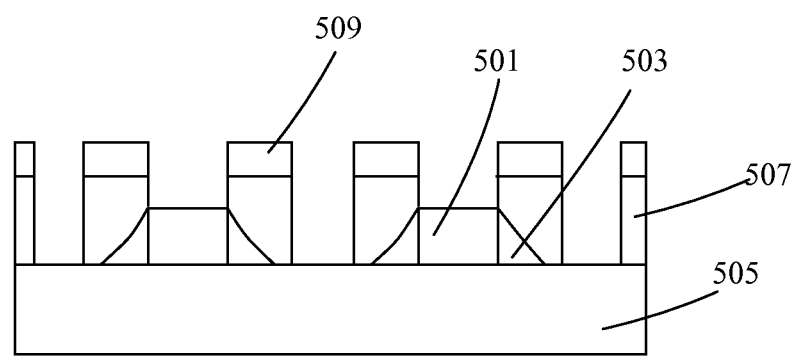
Figure 7:
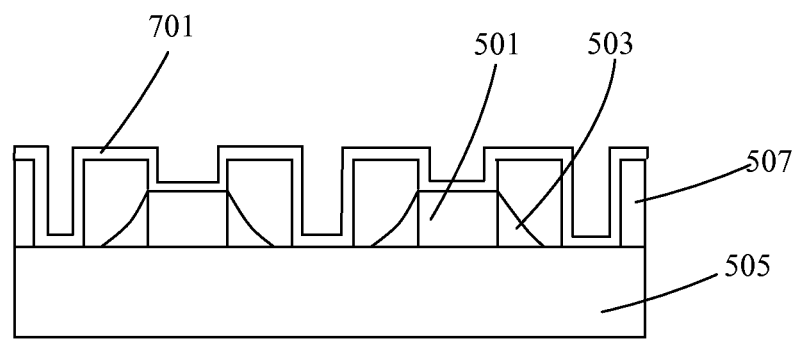

As illustrated in FIG. 6, ILD 507 is etched through mask 509. Mask 509 is then stripped, and a metal 701, for example nickel, nickel alloy, e.g., 90% Ni and 10% Pt, or cobalt (Co), is deposited over all exposed surfaces, as illustrated in FIG. 7. Metal 701 may be deposited to a thickness of 5 nm to 30 nm.

Figure 8:
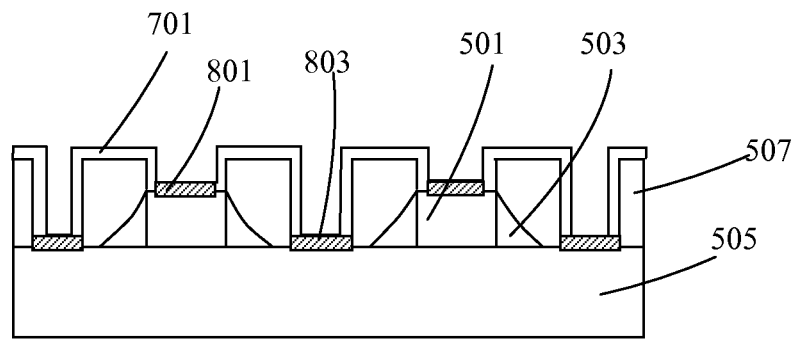

Adverting to FIG. 8, the substrate is annealed to a temperature of 300° C. to 400° C. to effect silicidation. However, only the portions of metal 701 contacting silicon, such as gates 501 and active areas between gates 501 are silicided, forming silicide portions 801 and 803, respectively.

Figure 9A:
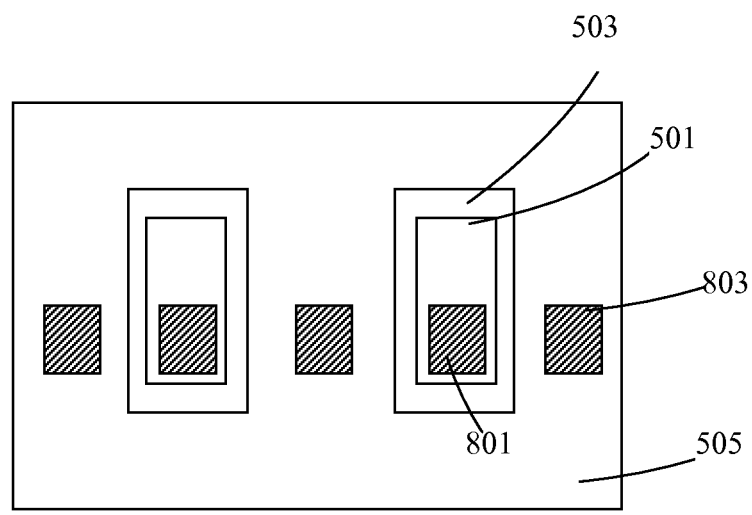
Figure 9B:
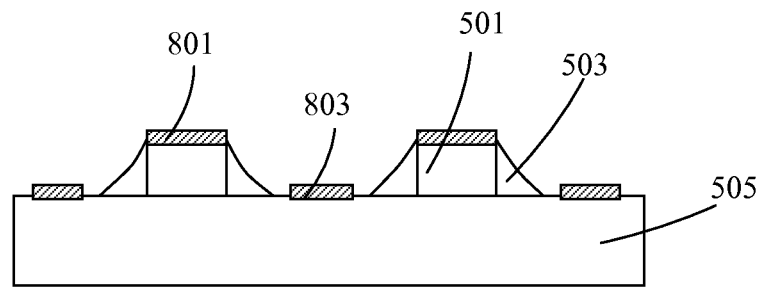

The remaining metal and ILD 507 may then be stripped, as illustrated in FIGS. 9A and 9B. The resulting silicide 801 and 803 is localized, rather than formed over entire gates and active regions. Subsequently, contacts may be formed (not shown for illustrative convenience) by conventional methods, as by depositing an ILD, aligning a mask with silicide portions 801 and 803, etching through the ILD, and filling with a contact material, such as for connection to metal lines. The mask must be correspondingly aligned to the same position as mask 509.

The embodiments of the present disclosure can achieve several technical effects, localized silicidation, which reduces encroachments and stringers from developing during silicidation, and which also eliminates the need for pre-silicidation cleaning. The present disclosure enjoys industrial applicability in any of any of various types of highly integrated semiconductor devices, particularly 32 nm devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a transistor on a substrate, the transistor having a gate electrode and source/drain regions;
   forming a masking layer over the substrate, the masking layer having openings exposing portions of the gate electrode and portions of the source/drain regions;
   depositing a metal in the openings on the exposed portions of the gate electrode and source/drain regions;
   forming metal silicide on the exposed portions of the gate electrode and source/drain regions; and
   removing unreacted metal and completely removing the masking layer,
   wherein the masking layer is formed by:
      forming an inter level dielectric (ILD) on the substrate, the ILD covering the transistor and having a substantially planar upper surface above an upper surface of the gate electrode;
      forming a lithographic mask on the ILD, the lithographic mask having openings corresponding to the exposed portions of the gate electrode and the source/drain regions;
      forming trenches in the ILD through the lithographic mask corresponding to the openings; and
      removing the lithographic mask.

2. The method according to claim 1, comprising forming the openings in the masking layer with an aspect ratio of 1:1 to 100:1.

3. The method according to claim 1, wherein the exposed portions of the gate electrode and source/drain regions comprise less than 100% of the entire gate electrode and source/drain regions, respectively.

4. The method according to claim 1, comprising forming trenches having a width of 10 nanometer (nm) to 100 nm.

5. The method according to claim 1, comprising forming trenches with an aspect ratio of at least 5:1.

6. The method according to claim 1, comprising forming the trenches by etching the ILD through the lithographic mask.

7. The method according to claim 1, comprising depositing the metal to a thickness of 5 nm to 30 nm.

8. The method according to claim 1, comprising depositing nickel or a nickel alloy as the metal.

9. The method according to claim 1, comprising forming the silicide by annealing.

10. The method according to claim 1, further comprising forming a second mask over the transistor and substrate, subsequent to removing unreacted metal and the masking layer, the second mask having openings aligned to the same positions as the lithographic mask.

11. The method according to claim 10, further comprising forming gate and source/drain contacts through the second mask.

12. A method comprising:
   forming one or more gate electrodes on a substrate, each gate electrode having spacers on opposite sides thereof;
   forming source/drain regions in the substrate on opposite sides of each gate electrode;
   forming an inter level dielectric (ILD) on the source/drain regions and the gate electrodes, the ILD covering the source/drain regions and the gate electrodes and having a substantially planar upper surface above an upper surface of the gate electrodes;
   forming a lithographic mask on the ILD, the lithographic mask having openings;
   aligning the openings of the lithographic mask with portions of the gate electrode and portions of the source/drain regions, the portions being less than 100% of the entire gate electrode and source/drain regions, respectively;
   etching trenches in the ILD through the lithographic mask corresponding to the openings, the trenches having a width of 10 nanometer (nm) to 100 nm and an aspect ratio of 1:1 to 100:1;
   removing the lithographic mask;
   depositing a metal in the trenches;
   annealing the metal to form metal silicide in the trenches; and
   removing unreacted metal and completely removing the ILD.

13. The method according to claim 12, comprising depositing the metal to a thickness of 5 nm to 30 nm.

14. The method according to claim 13, comprising depositing nickel or nickel alloy as the metal.

15. The method according to claim 12, comprising:
   forming a second ILD on the gate electrodes, the source/drain regions, and the metal silicides, subsequent to removing unreacted metal and completely removing the ILD;
   forming a second mask on the second ILD, the second mask having openings corresponding to the portions of the gate electrode and the portions of the source/drain regions; and
   aligning the second mask to the same position as the lithographic mask.

16. The method according to claim 15, comprising etching the second ILD through the second mask to form gate and source/drain contact holes down to the metal silicides.

* * * * *